United States Patent [19]

Mossberg

[11] Patent Number: 5,276,637
[45] Date of Patent: Jan. 4, 1994

[54] SWEPT-CARRIER FREQUENCY SELECTIVE OPTICAL MEMORY AND METHOD

[75] Inventor: Thomas W. Mossberg, Eugene, Oreg.

[73] Assignee: State of Oregon acting by and through the State Board of Higher Education on behalf of the University of Oregon, Eugene, Ohio

[21] Appl. No.: 858,330

[22] Filed: Mar. 25, 1992

[51] Int. Cl.⁵ .................. G11C 13/02; G11C 13/04
[52] U.S. Cl. .................. 365/106; 365/151; 365/153; 365/119
[58] Field of Search ............ 365/106, 120, 127, 151, 365/153, 119

[56] References Cited

U.S. PATENT DOCUMENTS

| | | | |
|---|---|---|---|
| 3,568,167 | 3/1971 | Carson | 340/173 |
| 3,896,420 | 7/1975 | Szabo | 340/173 |
| 4,101,976 | 7/1978 | Castro et al. | 365/119 |
| 4,158,890 | 6/1979 | Burland | 365/119 |
| 4,459,682 | 7/1984 | Mossberg | 365/119 |
| 4,956,812 | 9/1990 | Seya et al. | 365/119 |

OTHER PUBLICATIONS

Bai et al., "Real-Time Optical Waveform Convolver/Cross Correlator," *Appl. Phys. Lett.* 45:714-716 (1984).
Babbitt et al., "Mixed Binary Multiplication of Optical Signals by Convolution in an Inhomogeneously Broadened Absorber," *Applied Optics* 25:962-965 (1986).
Mossberg, "Time-Domain Frequency-Selective Optical Data Storage," *Opt. Lett.* 7:77-79 (1982).
Carlson et al., "Temporally Programmed Free-Induction Decay," *Phys. Rev.* 30 A:1572-1574 (1984).
Babbitt et al., "Convolution, Correlation, and Storage of Optical Data in Inhomogeneously Broadened Absorbing Materials," *Proceedings of SPIE, Advances in Optical Information Processing II* 639:56-63 (Apr. 1986).
Hoyt, "Spectral Hole-Burning in the Storage Hierarchy?," In *Persistent Spectral Hole-Burning: Science and Applications, Summaries of Papers Presented at the Persistent Spectral Hole-Burning: Science and Applications Topical Meeting,* Sep. 26-28, 1991, Monterey, Calif., 1991 Technical Digest series, vol. 16, Optical Society of America, pp. 214-217 (1991).
Mossberg, "Temporal Accessing of Frequency-Domain Optical Storage: Specific Approaches and General Considerations," *Persistent Spectral Hole-Burning: Science and Applications, Summaries of Papers Presented at the Persistent Spectral Hole-Burning: Science and Applications Topical Meeting,* Sep. 26-28, 1991, Monterey, Calif., 1991 Technical Digest Series, vol. 16, pp. 164-169 (1991).
Kachru, "Stimulated Echo Optical Memory," In *Proceedings of the 3-D Memory Workshop,* Snowbird, Utah, Mar. 1990, pp. 64-67 (1990).

*Primary Examiner*—Eugene R. LaRoche
*Assistant Examiner*—Andrew Tran
*Attorney, Agent, or Firm*—Klarquist, Sparkman, Campbell, Leigh & Whinston

[57] ABSTRACT

Data storage methods and apparatus are disclosed that utilize a swept-carrier optical approach with an inhomogeneously broadened absorber material having multiple special storage cells. Data are encoded on a data pulse by appropriately modulating the data pulse. Data storage in a storage cell is effected by exposing the cell to the data pulse and a reference pulse cotemporal with the data pulse. Both the data and reference pulses are frequency-chirped across the inhomogeneously broadened bandwidth of the absorber material, the data pulse being chirped at a frequency that is offset relative to the reference pulse. Data retrieval from the storage cell is performed by exposing the cell to a read pulse which causes the cell to produce a signal pulse comprising the encoded data. The read pulse can have a temporal profile that produces a signal pulse shaped either similarly to the data pulse or as a mirror image of the data pulse.

37 Claims, 5 Drawing Sheets

SWEPT-CARRIER FREQUENCY SELECTIVE OPTICAL MEMORY AND METHOD

FIELD OF THE INVENTION

This invention relates to optical data storage systems and methods for storing data in and retrieving data from such systems.

BACKGROUND OF THE INVENTION

The simplest optical data system stores and recalls data by means of either absorption or reflection of a light beam interacting with atoms or molecules comprising a data storage material. A series of data bits can be stored in and read from the storage material by directing a beam of light to spatial storage cells on the material. A "spatial storage cell" is a spatially distinct region of the storage material capable of storing at least one bit of data. An example of a spatial storage cell is a region having a defined area on the surface of the material and extending depthwise, within the length and width boundaries of the cell, into the thickness dimension of the material. A typical unit of data storage material has many millions, if not billions, of storage cells. Each cell can be individually and separately "addressed" for data storage or retrieval by using a laser beam.

The ultimate optical memory device would be one in which a bit of data could be stored in virtually every atom or molecule of the storage material. Such an optical memory would have a storage capacity of about $10^{22}$ bits per cm$^3$. However, as discussed further below, this ultimate goal is unattainable by current technology.

One promising class of optical memories consists of so-called "frequency-selective optical data storage" (FSDS) memories. A volatile FSDS memory is disclosed in Szabo, U.S. Pat. No. 3,896,420 (Jul. 22, 1975). A relatively non-volatile FSDS memory is disclosed in Castro et al., U.S. Pat. No. 4,101,976 (Jul. 18, 1978).

In general, the spatial dimensions of individual storage cells in optical memories cannot be smaller than $\zeta$, the wavelength of light employed to add data to and read data from the memory. Since the wavelengths of lasers typically used for writing data into and reading data from optical memories are about $10^{-4}$ cm, the maximal usable number of spatial storage cells in the memory is about $10^{12}$ per cm$^3$.

FSDS memories are advantageous in that they allow atoms or molecules within a spatial storage cell to be addressed both spatially and spectrally. Since such a memory has the three usual spatial dimensions plus one frequency "dimension," it is often referred to as a "four-dimensional" memory.

Figure 1:
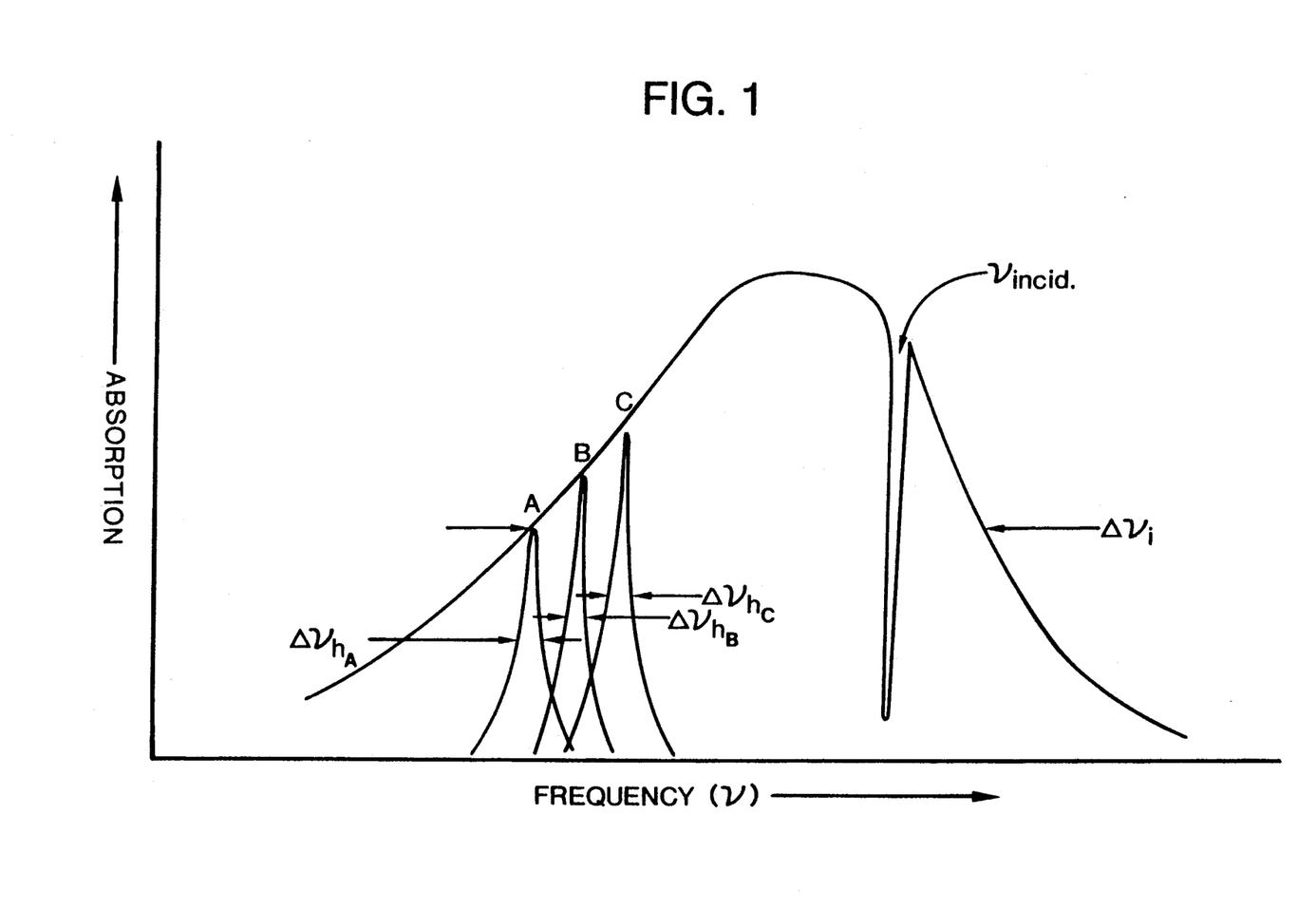
FIG. 1 is a graphical representation of certain parameters pertaining to optical data storage according to the present invention, including the inhomogeneously absorption bandwidth $\Delta\nu_i$ of a storage material and the homogeneous absorption linewidth $\Delta\nu_h$ of a spectral channel.

FSDS methods utilize data-storage materials in which the storage cells exhibit an "inhomogeneously broadened" absorption profile, as shown in FIG. 1. An inhomogeneously broadened spectral profile having width $\Delta\nu_i$ in FIG. 1 is a composite of a number of homogeneous spectral lines (e.g., $\Delta\nu_{hA}$, $\Delta\nu_{hB}$, and $\Delta\nu_{hC}$ in FIG. 1) each exhibiting a slightly different resonant frequency. Although such data-storage materials typically comprise a substantially uniform assemblage of constituent atoms or molecules, the inhomogeneously broadened spectral profiles of these materials are wider, often much wider, than the absorption profiles of the constituent atoms or molecules. This is because the microenvironment surrounding each individual atom or molecule in the material is different for each atom or molecule which, in turn, imparts a variation in the absorption profile of each atom or molecule. Such microenvironments include small variations in the local electric field surrounding each atom or molecule relative to neighboring atoms or molecules and, in the case of crystalline materials, various imperfections in the crystalline matrix of the material. Thus, each constituent atom or molecule of a storage cell displays a spectrally narrow (i.e, "homogeneous") resonance each having a width of $\Delta\nu_h$. The resonances of the individual atoms or molecules in the cell are collectively spread over the inhomogeneously broadened frequency range (having a width of $\Delta\nu_i$). Of course, since each storage cell consists of billions of atoms or molecules, it is virtually certain that any given $\Delta\nu_h$ will be exhibited by more than one atom or molecule in the cell.

In FSDS, if a spatial storage cell of a material having an inhomogeneously broadened spectral profile (i.e., of a material termed an "inhomogeneously broadened absorber" or "IBA") is illuminated by a source of electromagnetic radiation having a specific incident frequency, the entire cell does not undergo a photo-induced change in optical properties. Rather, only those particular atoms or molecules in the cell having a $\Delta\nu_h$ value at a resonant frequency corresponding to the particular incident frequency undergo such a photo-induced change. This results in formation of a "notch" or "hole" in the inhomogeneously broadened spectrum at the particular resonant frequency ($\nu_{incid}$ in FIG. 1). Such a frequency-selective saturation phenomenon is termed "hole burning" in the art. Since a number of holes can be burned into the inhomogeneously broadened spectral profile of each storage cell, it follows that, in FSDS memories, one can "write" more than one data bit in each storage cell.

The smallest currently usable spatial storage cell has surface dimensions of about $10^{-4}$ cm on a side. (Individual atoms are about $10^{-8}$ cm across.) Assuming that such a cell has a depth of $10^{-4}$ cm, about $10^{12}$ atoms would be present in the cell. In some storage materials, up to $\Delta\nu_i/\Delta\nu_h \approx 10^7$ frequency subdivisions are possible in each spatial storage cell. Thus, by addressing atoms in the cell both spatially and spectrally, it is possible to individually address groups of atoms containing only about $10^5$ atoms each (wherein each group exhibits a different $\Delta\nu_h$). To address the same number of atoms with spatial addressing alone, the storage cell would have to be less than $10^{-6}$ cm across, which is too small to be addressable by current technology. With combined spatial and spectral addressing, it is possible to attain data storage densities of $10^{18}$ bits per cm$^3$ of memory volume, which is $10^7$ times denser than what is obtainable with current magnetic memories that offer a surface bit density of about $10^{15}$ bits/cm$^2$.

Two general types of FSDS memories are known in the art, both of which can (at least in principle) achieve the same ultimate data storage density. The first type is termed "directly addressed" FSDS (also known in the art as "frequency-domain" FSDS) and the second type is termed "temporally addressed" FSDS (also known in the art as "time-domain" FSDS), both of which are briefly described below.

Both FSDS approaches are limited by certain fundamental relationships. For example, in either approach, a monochromatic light source such as a laser is used for data writing and reading. Digital data to be stored ("written") in the memory can be in the form of digital pulses ("ones" and "zeros") superimposed on the substantially monochromatic frequency of the laser. Such pulses are typically created by passing the laser beam through a controllable shutter. If the shutter is open for a time $\tau$, the resulting pulse passing through the shutter has a duration $\Delta\tau_{pulse} = \tau$. However, even though the laser beam upstream of the shutter is monochromatic, the pulse passing through the shutter will experience a frequency spread having a width $\Delta\nu_{pulse}$ about the laser's monochromatic light frequency $\nu_L$. Thus, $\Delta\nu_{pulse} = 1/\Delta\tau_{pulse}$. The longer the pulse, the narrower (i.e., more monochromatic) the frequency spectrum of the pulse. This relationship, termed the Fourier bandwidth theorem, significantly impacts how much data can be written into an optical memory that is spectrally addressed. With memories employing spectral channels of a specific frequency width, a minimum time is required to access a single spectral channel; the narrower the spectral channel, the longer the access time required.

In "directly addressed" FSDS such as disclosed in Burland, U.S. Pat. No. 4,158,890 (Jun. 19, 1979), and in Szabo, U.S. Pat. No. 3,896,420 (Jul. 25, 1975), highly monochromatic lasers are utilized for data storage and retrieval. A "data-write" laser is spatially positioned to address the various spatial storage cells on a storage material and frequency-swept to address individual spectrally distinguishable subgroups of atoms or molecules within each spatial storage cell. (Each such spectrally distinguishable subgroup is termed a "spectral channel"). Within a spectral channel, an "on" bit is represented by a write-induced change in the absorptivity of the active atoms or molecules in the channel.

The ultimate narrowness of the spectral channels is determined by the homogeneous absorption bandwidth $\Delta\nu_h$ of the corresponding storage material. The homogeneous absorption bandwidth $\Delta\nu_h$ is an expression of the range of light frequencies (about an atom- or molecule-specific median frequency) within which an atom or molecule in the spectral channel will strongly interact with an incident light beam. If spectral channels are spaced at less than $\Delta\nu_h$, writing data to one spectral cell will affect data stored in spectrally adjacent cells. Therefore, maximal storage density is achieved when the spectral channel width is equal to $\Delta\nu_h$.

The drawbacks associated with directly-addressed FSDS arise from a need to rapidly tune the read and write lasers to specific frequencies. This is because the data bits are written (and read) sequentially directly into (and from) frequency-domain spectral channels. Also, a spectral channel of width $\Delta\nu_h$ cannot be individually accessed in a time shorter than about $\Delta\nu_h^{-1}$. Therefore, the data input/output rate of directly addressed FSDS memories is rather slow, limited to about $\Delta\nu_h$ bits per second. (The maximum speed at which holes can be burned is determined by the relationship $\Delta t_h \Delta\nu_h \approx 1$, where $\Delta\nu_h$ is the single-channel access time and $\Delta\nu_h$ is the spectral width of the channel.) For example, in a storage material having $10^7$ spectral channels, the minimal spectral channel width is equal to $\Delta\nu_h = 10^3$ Hz. With such a channel width, the maximum data transfer rate is only 1 Kilobit/sec. Since a cm$^3$ of such a material could contain $10^{18}$ bits of information, it would take millions of years to write or read such a memory at 1 Kilobit per second.

Therefore, it is impossible using directly addressed FSDS to simultaneously optimize storage density and memory speed. I.e., if the storage capacity of the absorbing material in the memory is increased by making each spectral channel narrow, one unavoidably increases the time needed to create and retrieve information from that spectral channel.

"Temporally addressed" FSDS is also termed "time-domain" FSDS or "stimulated echo FSDS" in the art. Mossberg, U.S. Pat. No. 4,459,682 (Jul. 10, 1984); Carlson et al., Phys. Rev. A 30:1572 (1984); Bai et al., Opt. Lett. 11:724 (1986); Mossberg, Optics Lett. 7:77-79 (1982). In temporally addressed FSDS, the maximum permissible rate at which storage cells are accessed is also dependent upon the material comprising the data storage medium. During data "writing," each spatial storage cell is exposed to a writing laser beam for a time that can be as long as $\Delta\nu_h^{-1}$. However, unlike directly addressed FSDS, each spectral channel within a spatial storage cell can be simultaneously addressed. I.e., $\Delta\nu_i/\Delta\nu_h$ bits (one for each available spectral channel) can be simultaneously encoded and stored in the cell. The storage of all these bits in the cell occurs in parallel during a time interval equal to that required to store a single bit in a cell using directly addressed FSDS.

In temporally addressed FSDS, two types of pulses are involved in a "writing" sequence (the storage of a bit stream in a spatial storage cell). One of said pulses is termed the "reference pulse" (also termed "preparation pulse," "write pulse," or "fixing pulse" in the art). The reference pulse can be temporally short compared to the bandwidth of the bit stream to be stored. The second pulse, termed the "data pulse" (also termed the "object pulse" or "writing pulse" in the art) consists of the actual stream of data bits to be stored in the cell.

The data pulse is produced by passing a laser beam through a high-speed laser shutter so as to digitally encode a train of binary bits onto the laser beam. The frequency content of such a data pulse is complex and unique to the particular data stream encoded therein. Since a temporally encoded laser pulse carries a unique frequency-spectrum signature, storage of such a spectrum in a cell constitutes a storage of all the temporally encoded data. By illuminating a single spatial storage cell using a temporally encoded data pulse, many of the spectral channels in the cell are simultaneously addressed.

The reference pulse is necessary for recording the data in the cell. If the cell is exposed only to the data pulse, then only the power spectrum of the data pulse is recorded, which is an insufficient basis for later recall (reading) of the data from the cell in a temporally faithful manner.

The reference pulse can either precede the data pulse or follow the data pulse. The temporal order of these pulses is a determinant of whether the data in the data pulse can be recalled from the cell as a faithful copy of the data pulse or as a time-reversed copy of the data pulse. See, Mossberg, U.S. Pat. No. 4,459,682; Carlson et al., Phys. Rev. 30:1572-1574 (1984). In either event, the reference and data pulses sequentially enter the cell.

Thus, in temporally addressed FSDS, it is the Fourier spectrum of the bit stream in the data pulse that is recorded in the spectral channels of the addressed cell. Because the write and data pulses constructively and destructively interfere with each other in exciting the active atoms or molecules comprising the cell, the time separations and phase relationships between these laser pulses are, in effect, holographically impressed on the absorbing atoms or molecules. This results in storage of information in the form of modulations in the hyperfine energy sublevels of the absorbing atoms or molecules as a function of absorption frequency. That is, the Fourier spectrum is represented through frequency-dependent changes in the absorption profile of the atoms or molecules comprising the cell. The spectral distribution of the atoms or molecules in the cell, after being exposed to the preparation and object pulses, is proportional to the Fourier transform of the object pulse.

Temporally addressed data in a storage cell are recalled or "read" by stimulating the storage cell to emit a coherent optical signal ("signal pulse") having the same duration and temporal envelope as the stored bit stream. Data reading is usually initiated by a single laser pulse, called the "read" pulse, which can be identical to the reference pulse. In effect, the read pulse causes the previously stored data to be holographically reexpressed. The signal pulse, then, is a result of constructive and destructive interactions of energy discharged from the previously stimulated atoms or molecules of the cell. The signal pulse can also be envisioned as an "echo" of the data pulse, wherein the signal pulse has the same temporal envelope as the data pulse. I.e., the temporal profile of the signal pulse is proportional to the Fourier transform of the spectral distribution of the excited population of atoms or molecules.

The signal pulse is a coherently emitted signal (which makes it highly directional). If the pulses involved in the writing sequence are colinear, the signal pulse will have directional properties essentially identical to the data pulse. In general, the wavevector of the signal pulse is related to the wavevectors of the pulses involved in the write sequence according to:

$$k_s = k_d + k_r - k_w$$

where $k_w$, $k_d$, $k_r$, and $k_s$ are the wavevectors of the write (reference), data, read, and signal pulses, respectively.

As discussed above, in the directly addressed FSDS method, data input and output rates are limited by the spectral channel width, and by the fact that each spectral channel within each spatial storage cell must be serially addressed. With temporally addressed FSDS, the ability to address all spectral channels of a spatial storage cell in parallel provides a substantial speed advantage of $\Delta\nu_i/\Delta\nu_h$ over directly addressed FSDS. However, the total duration of the write sequence (write and data pulses) for each channel must be shorter than the homogeneous dephasing time of the storage material. Data input and output must occur at a rate of $\Delta\nu_i$ bits per second in order to utilize the full storage potential of the storage material. In cases where $\Delta\nu_i$ exceeds obtainable rates of data input and output, only $\Delta\nu_m/\Delta\nu_h$ bits (where $\Delta\nu_m$ is the maximum achievable rate of data input and output; i.e., the maximum achievable data modulation rate) can be stored using temporal addressing FSDS. This can also pose a substantial rate limitation because full inhomogeneous absorption bandwidths often exceed currently achievable modulation rates.

Therefore, there is a need for optical memories that allow one to achieve complete spectral utilization of the storage material while employing variable rates of data input and output.

SUMMARY OF THE INVENTION

The present invention fills the aforementioned need by providing optical data storage methods and apparatuses that utilize a swept-carrier approach. To effect data storage, a data pulse and a reference pulse are utilized. However, instead of exposing a data storage material to data and reference pulses sequentially, the data and reference pulses are cotemporal. In addition, the data and reference pulses are both frequency-chirped across the inhomogeneously broadened bandwidth of the storage material, wherein the data pulse is chirped at a frequency that is offset relative to the reference pulse. Encoded onto the envelope of the data pulse are data to be recorded in spatial storage cells of the storage material, wherein such recording is performed by modulating the data pulse.

Stored data is retrievable from the storage material by first providing a read pulse that is substantially identical to the reference pulse. Then, storage cells of the storage material containing data to be recalled are exposed to the read pulse. The read pulse causes the storage cell(s) exposed thereto to produce a signal pulse comprising the encoded data. Depending upon the temporal profile of the read pulse relative to the reference pulse, the signal pulse has a shape that is either similar to the data pulse or is a mirror image of the data pulse.

DETAILED DESCRIPTION

The following terms and expressions are used herein:

Homogeneous absorption linewidth ($\Delta\nu_h$) is the frequency interval over which individual atoms or molecules will absorb electromagnetic radiation.

Homogeneous dephasing time ($\tau_h = \Delta\nu_h^{-1}$) is the time interval over which individual atoms within an inhomogeneously broadened absorber lose phase memory. In the simplest case, this time is equal to twice the excited state population decay time, but generally is shorter. The magnitude is transition-specific.

Inhomogeneous absorption bandwidth ($\Delta\nu_i$) is the frequency interval over which the storage material as a whole exhibits absorption of electromagnetic radiation.

Inhomogeneous dephasing time ($T_2^* = \Delta\nu_i^{-1}$) is the time interval over which atoms or molecules collectively lose their phase memory.

Spectral channel is a spectral interval within a spatial storage cell reserved for the storage of one data bit. The spectral channel has a width $\Delta \nu_c \geq \Delta \nu_h$.

Pulse spectrum is the distribution of frequency components constituting a temporal waveform, wherein $\Delta \nu_{pulse} \Delta \tau_{pulse} \geq 1$ and $\Delta \nu_{pulse}$ is the width of the pulse spectrum and $\Delta \tau_{pulse}$ is the duration of the pulse.

$\tau_{access}$ is the time required to write or read data to a specific spatial-spectral memory location.

$\Delta \tau_m$ is the temporal width of a data bit encoded on a data pulse.

$\nu_m$ is a data pulse modulation rate (bits/sec).

$\tau_{WR}$ is the duration of a swept-carrier writing sequence.

$\nu_{RD}$ is the frequency offset between the reference and data pulses.

$\nu_R(t)$ and $\nu_D(t)$ are the carrier frequencies of the reference and data pulses, respectively, as functions of time.

$\nu_{CH}$ is the total frequency interval over which $\nu_R(t)$ and $\nu_D(t)$ are swept.

$r_{CH}$ is the chirp rate of reference and data pulses (Hz scanned/sec).

The present invention pertains to a new hybrid approach to the utilization of spatial-spectral optical memories. As in the temporally addressed FSDS method, data to be stored is temporally encoded onto the envelope of a data pulse. A write (reference) pulse is also employed. However, unlike the temporally addressed FSDS method, the reference and data pulses cotemporally (rather than sequentially) irradiate each cell. The reference and data pulses are displaced in frequency relative to each other. Widely separated spectral channels are accessed through frequency control of the reference and data pulses rather than through high input/output rates. Frequency control of the writing laser is performed by imposing a "chirp" (i.e., ramped linear increase or decrease in frequency) onto the reference and data pulses. This hybrid approach to optical data storage is termed a "swept-carrier" approach. Since the duration of the "writing sequence" (i.e., the combination of a reference pulse and a data pulse) can be much longer in the present swept-carrier approach than in the temporally addressed FSDS method, the swept-carrier approach provides for a full spectral utilization of the storage material at a wide variety of data input/output rates (i.e., data pulse modulation rates), including currently achievable rates that would be less than optimal for temporally addressed FSDS.

The present invention utilizes an inhomogeneously broadened absorber (IBA) material. The inhomogeneously broadened bandwidth of the material is $\Delta \nu_i$ and the homogeneous bandwidth of each of the constituent spectral channels is $\Delta \nu_h$. Therefore, the number of available spectral channels in the material is given by $n_c = \Delta \nu_i / \Delta \nu_h$. For long-term data storage, it is assumed that a trap state exists such that a subpopulation of excitable atoms or molecules of the storage material transferred to an excited state (as a result of exposure to a writing sequence) remains separated from a residual lower-state subpopulation for extended periods.

In conventional temporally addressed FSDS methods, as discussed hereinabove, data is stored by illuminating a single spatial storage cell by a sequence of two temporally distinct pulses, a reference pulse and a data pulse. These two pulses modify the ground-state population $\rho_{gg}$ of excitable atoms or molecules in the cell (and hence the absorption profile of the cell) so as to contain a frequency dependence proportional to $$\rho_{gg}(\nu) \propto [(E_{ref}^\infty(\nu))^* E_{data}^\infty(\nu) + c.c.], \quad [1]$$

where $$E_i^{\tau max}(\nu) = \int_{-\infty}^{\tau max} E_i(t - \eta_i) \exp(-2\pi i \nu t) dt, \quad [2]$$

$\eta_i$ is the retarded time of occurrence of pulse i, i is $(-1)^{\frac{1}{2}}$, and c.c. is a complex conjugate.

Under appropriate conditions, the data pulse can be recreated from the spectral information stored in $\rho_{gg}$ by a read pulse, which stimulates the cell to produce a signal pulse. The signal field generated by the read pulse is of the form $$E_{sig}(t) \propto \quad [3]$$

$$\int_{-\infty}^{\infty} g(\nu)[E_{read}^\infty(\nu)][(E_{ref}^\infty(\nu))^* E_{data}^\infty(\nu) + c.c.] \exp(2\pi i \nu t) d\nu$$

where $g(\nu)$ represents the original absorption profile of the storage material. Equation [3] was derived under the assumption that each excitation field transfers a small fraction of the active atoms or molecules in the cell to the excited state.

In the context of the conventional time-domain FSDS approach, the envelope of the signal pulse (Equation [3]) reproduces the envelope of the data pulse so long as the reference and read pulses: (a) are both short compared to $\nu_m^{-1}$, where $\nu_m$ is the data encoding rate (modulation rate) in the data pulse (Mossberg, Optics Lett. 7:77 (1982)); or (b) possess substantially identical frequency chirps over the bandwidth $\nu_m$ (Bai et al., Optics Lett. 11:724 (1986)); or (c) have identical phase noise and a bandwidth greater than $\nu_m$ (Zhang et al., Optics Lett. 16:103 (1991)). Furthermore, in all implementations of the conventional time-domain FSDS methods, the duration full utilization of the frequency dimension of a storage cell requires that $\nu_m \approx \Delta \nu_i$. Under conditions of accurate data pulse reproduction, the read pulse and the signal pulse have the same temporal arrangement as the reference and data pulses, respectively.

The above-listed conditions in the conventional time-domain FSDS approaches for accurately reproducing the data pulse in the signal pulse are severely limiting. Use of all the spectral channels available in a storage material requires a modulation rate ($\nu_m$) at $\Delta \nu_i$, which is impossible for many storage materials using conventional technology. These conditions also limit the conventional time-domain FSDS approach to storage materials that exhibit an extremely narrow homogeneous linewidth ($\Delta \nu_h$) so as to allow enough time to access the spectral channels. As discussed above, the narrower the homogeneous linewidth $\Delta \nu$, the longer the time available to access all the channels. Also, these conditions eliminate any chance of using storage materials at temperatures higher than cryogenic temperatures because warming broadens the homogeneous linewidth ($\Delta \nu_h$) of the material.

Figure 2A:
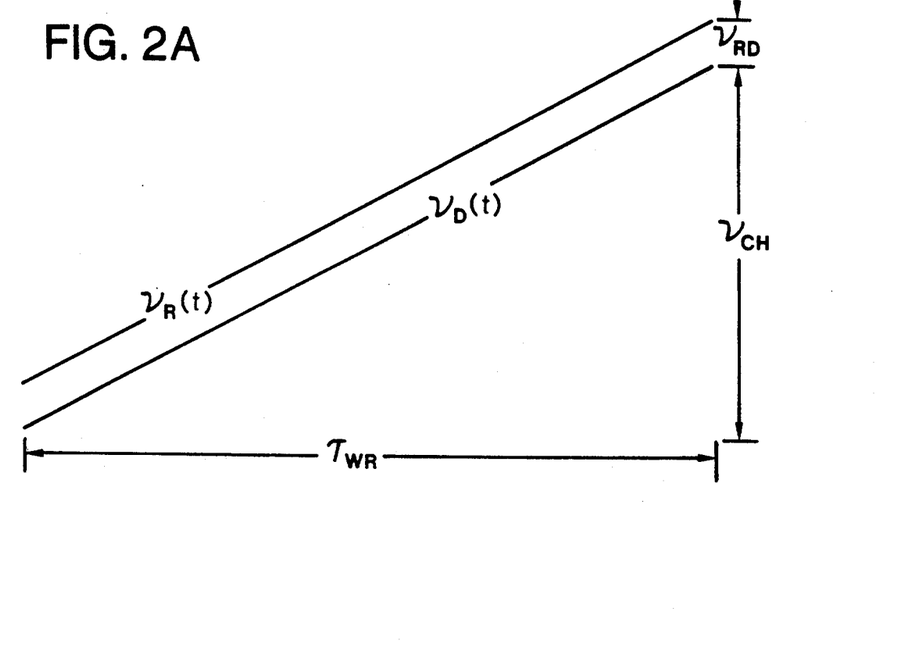
FIG. 2A is a plot showing typical data and reference pulses according to the present invention, including graphical representations of the duration of the swept-carrier write sequence ($\tau_{WR}$), the total frequency interval over which the data and reference pulses are swept ($\nu_{CH}$), and the frequency offset between the reference and data pulses ($\nu_{RD}$).
Figure 2B:
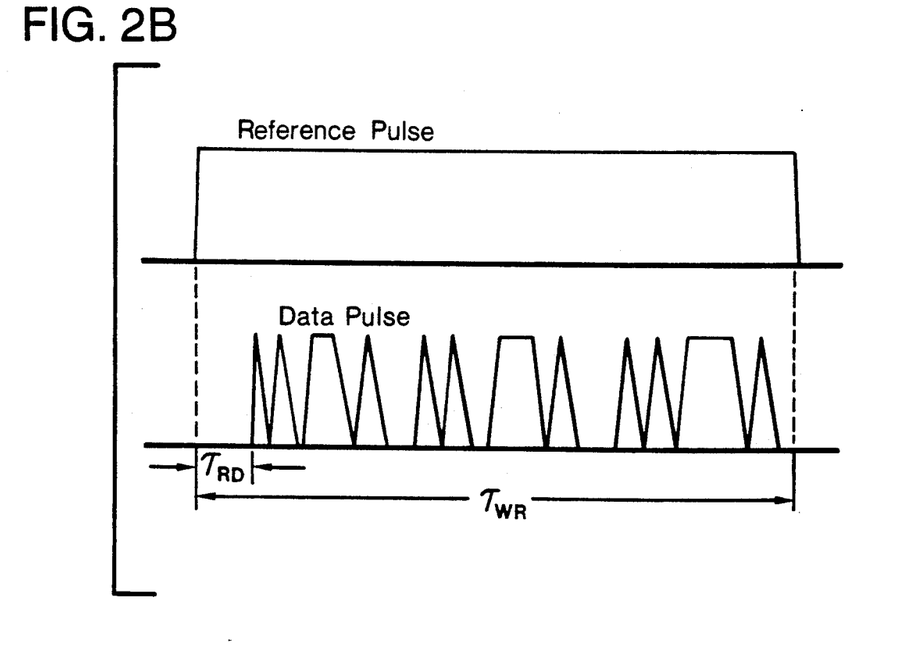
FIG. 2B shows the relative timing of reference and data pulses according to the present invention.

Certain aspects of the data and reference pulses according to the present invention are shown in FIGS. 2A and 2B. In contrast to temporally addressed FSDS, a writing sequence has a duration $\tau_{wr}$ which may potentially be much longer than $\tau_h$. During at least most of the writing sequence, the reference and data pulses overlap (i.e, they are cotemporal). FIG. 2A includes a plot of $\nu_R(t)$, which is the instantaneous carrier frequency of the reference pulse, and $\nu_D(t)$, which is the instantaneous carrier frequency of the data pulse. As can be seen, $\nu_D(t) = \nu_R(t) - \nu_{RD}$, where $\nu_{RD}$ (the instantaneous frequency offset between the reference and data pulses) is a constant. It can also be seen that $\nu_R(t)$ varies in a ramped, essentially linear fashion over a frequency interval $\nu_{CH}$. This ramped change in frequency is termed a "chirp." (Small deviations in the chirp of the reference pulse from linearity pose no problem so long as such deviations are duplicated in the read pulse.) FIG. 2B shows the relative timing of the reference and data pulses. In FIG. 2A, the total duration of the writing sequence can greatly exceed $\tau_h$.

Assuming that $\nu_m << \Delta\nu_i$, which is the most effective situation for the purpose of data storage according to the present invention, the parameters $\tau_{WR}$, $\nu_{RD}$, $\nu_{CH}$, and $\nu_m$ must satisfy a number of conditions if the data pulse spectrum is to be accurately stored according to the present invention. First, the frequency offset between the reference and data pulses must satisfy the relation $\nu_{RD} > \nu_m$. This inequality ensures that single spectral channels "see" the excitation fields distinctly and in the correct temporal order. Second, if $\tau_{CH} = \nu_{CH}/\tau_{WR}$, then $\tau_{CH}\tau_h > \nu_m$, thereby ensuring that the single-channel writing sequence has an apparent duration less than $\tau_h$. These first two conditions ensure that the Fourier spectra of the reference and data pulses are smooth on the scale of $\Delta\nu_h$ and can thus be accurately represented with the available spectral resolution of the storage material. Finally, $\tau_{CH}\tau_{WR}$ must be less than or equal to $\Delta\nu_i$ so as to not exceed the inhomogeneous absorption bandwidth of the storage material. The first two conditions ensure that the absorption profile of the storage material is modified precisely as in the conventional temporally addressed FSDS approach. The last condition ensures that the storage material can accommodate the full data-pulse spectrum. (The above conditions are set forth under the assumption that $\nu_m > \Delta\nu_h$.)

If a "read" pulse, identical to the reference pulse, is applied at a later time, a signal field is generated as described by $$E_{sig}(t) \propto \int_{-\infty}^{\infty} g(\nu)[E_{read}^{\tau obs}(\nu)][(E_{ref}^{\infty}(\nu))^* E_{data}^{\infty}(\nu) + c.c.] \exp(2\pi i \nu t) d\nu \qquad [4]$$

It will be noted that this equation is similar to Equation [3] except that $E^{\infty}_{read}(\nu)$ is replaced with $E_{read}^{obsT}(\nu)$. Application of Fourier analysis reveals that the integral of Equation [4] constitutes (i.e., that the signal field emitted possesses a temporal envelope representing) the convolution of $E_{data}(t)$ with the cross-correlation of $E_{ref}(t)$ and $E_{read}(t)$. This is true even during the read pulse so long as the portion of $E_{read}(t)$ that has already occurred is used in the cross-correlation. The cross-correlation, denoted as $\sigma(\tau_{obs})$, is sharply peaked with an approximate temporal width of $\nu_{CH}\tau_{obs})^{-1}$, where $\nu_{CH}\tau_{obs}$ is the spectral width of the read pulse at time t. When the data pulse is convolved with $\sigma(\tau_{obs})$, it is found that $E_{sig}(t) \approx E_{data}(t)$. The relative temporal and spectral behavior of $E_{sig}(t)$ can be obtained from FIGS. 2A and 2B, substituting the read pulse for the reference pulse and the signal pulse for the data pulse. If the read pulse duplicates only a fraction of the reference pulse, the signal reproduces only the corresponding portion of the data pulse.

At low modulation rates, $(\nu_m^2 < \tau_{CH})$, each frequency channel within the storage material will "see" the writing sequence as a series of two essentially featureless pulses. In this case, time-reversed and variable-rate data recall should be possible.

Since the signal and read pulses are substantially cotemporal, they cannot be colinear. The signal pulse will be strong provided the process is phase-matched according to the condition $$k_{sig} = k_{data} + k_{read} - k_{ref}. \qquad [5]$$

This is the same phase-matching condition as found in the conventional temporally addressed FSDS approach, discussed above. Orientation of the beams so as to satisfy equation [5] allows for signal pulse propagation in an isolated direction.

The input pulse (i.e., reference and data pulses) intensity will optimize the emitted signal size if the reference and data pulse approach, but do not reach, values needed to produce "$\pi/2$-pulse" level excitations in the various spectral channels. At higher intensities, the linear approximations leading to Equation [4] fail. The long writing sequences made possible with the present method require the lowest possible input-pulse intensities. So long as the storage material is nearly one weak-field absorption-length thick, optimal signal intensities will be on the order of one percent of the data pulse intensities.

According to the present invention, the writing sequence can be as long as $\tau_{WR}^{max} \approx \Delta\nu_i \tau_h/\nu_m >> \tau_h$. Considering that the data modulation rate $\nu_m$ need not greatly exceed $\Delta\nu_h$, the writing sequence can be very long indeed relative to the $\tau_h$-limited writing sequence of the conventional temporally addressed FSDS method. On the other hand, data modulation rates as large as $\Delta\nu_i$ can be accommodated with a concomitant decrease in $\tau_{WR}$. Since $\nu_m$ can be varied without sacrificing storage capacity, quantum-beat type effects (Mitsunaga et al., *Phys. Rev. Lett.* 63:754 (1989)) that arise at high modulation rates in some storage materials can be avoided. Furthermore, signal degradation consequent to excitation-induced frequency shifts (Huang et al., *Phys. Rev. Lett.* 63:78 (1989)) can be minimized because relatively few atoms are excited per unit time and a steady-state may be approached. (Long write sequences may allow relatively long-running holographic "movies" to be stored and played.) The maximum number of bits that can be stored is $\tau_{WR}^{max} \nu_m = \Delta\nu_i/\Delta\nu_h$, which corresponds to the number of spectral channels available.

Figure 3:
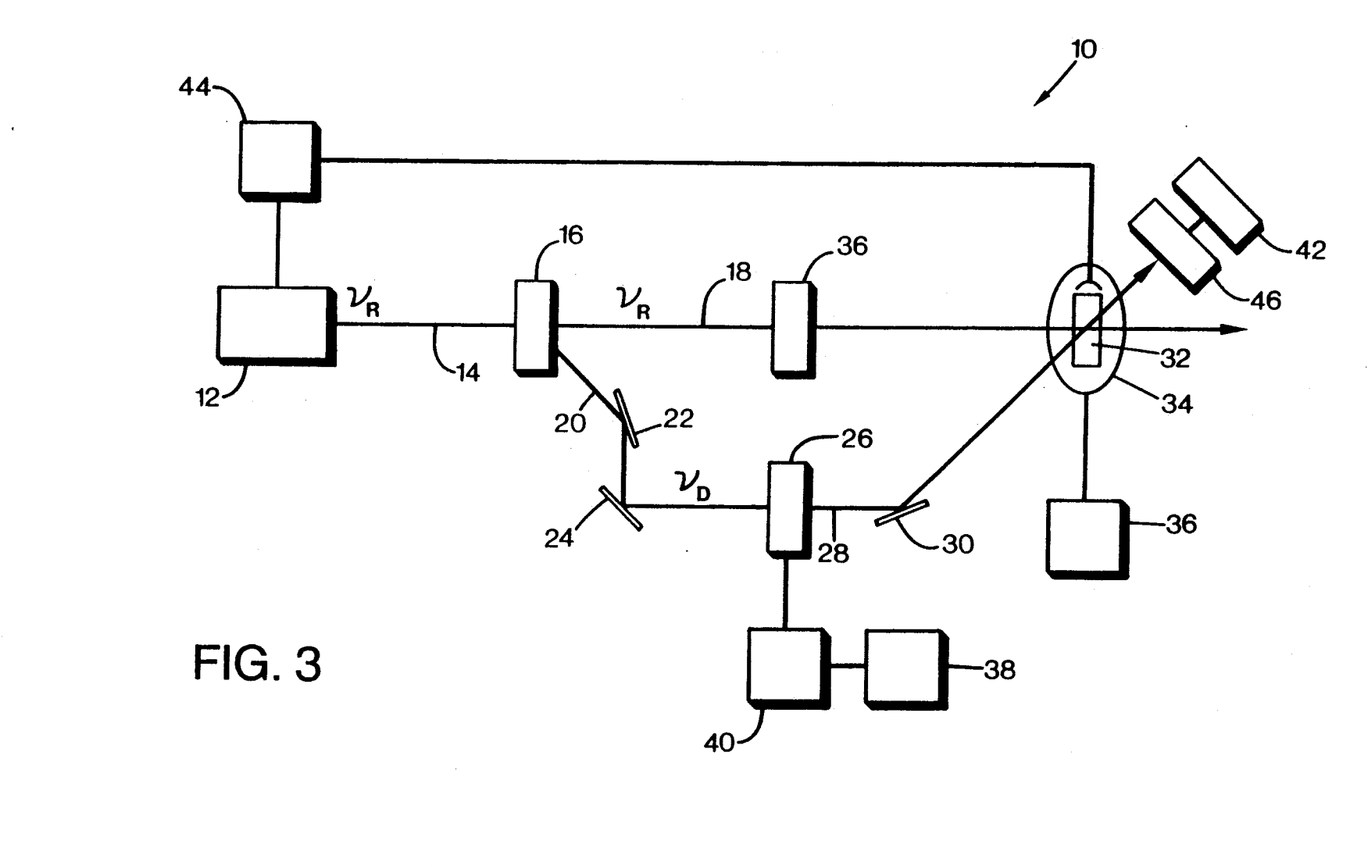
FIG. 3 is a schematic diagram of an embodiment of an optical memory according to the present invention utilizing a single laser.

One embodiment of a data storage system 10 is illustrated schematically in FIG. 3, showing a system capable of writing and retrieving data onto and from a matrix of spatial storage cells of a storage material. A source 12 of electromagnetic radiation that can be frequency-chirped is employed. The electromagnetic-radiation source 12 emits a chirped beam 14 of monochromatic electromagnetic radiation. The beam 14 passes through a frequency shifter 16 which splits the beam into two beams 18, 20. The beam 20, having a frequency $\nu_D$ displaced from the frequency $\nu_R$ of beam 14 by an amount $\nu_{RD}$ (FIG. 2A) in a spectral direction chosen so as to make the frequency-chirp lag of beam 20 that of beam 14, will become the data-pulse beam. Mirrors 22, 24 direct the beam 20 to a first modulator 26, which can be an acousto-optic modulator (AOM), electro-optic modulator (EOM) or analogous means for adding data to the beam 20. The resulting beam 28 is directed by a mirror 30 to the storage material 32 encased in a cryogenic housing 34. The beam 18 also passes through a second modulator 36, similar to the first modulator 26, which is gated "on" whenever a reference pulse is needed.

Referring further to FIG. 3, the storage material 32 is preferably maintained at a cryogenic temperature. Such cooling can be effected by a cryostat 34 (supplied by coolant from a source 36) or by a commercially available closed-cycle refrigerator. Such cooling is required with certain storage materials so that they will exhibit a sufficiently large number of homogeneous frequency channels.

FIG. 3 also shows a data input device 38 which supplies data into a device termed a segmenter 40 containing a logic circuit. The segmenter 40 comprises a logic and timing circuit adapted to control the modulator 26 in response to an input signal. The segmenter 40 divides continuous data supplied by the data input device 38 into discrete packets of data containing an appropriate number of data bits capable of being written by each data pulse. The number of data bits which can be written by a data pulse is dependent in part upon such factors as the sensitivity of the detector 42, the ratio $\Delta\nu_i/\Delta\nu_h$, and the transition moment of the storage material 32. The packets of data generated by the segmenter 40 are conveyed to the first modulator 26, which then modulates the beam 20 in an information-containing way.

A matrix sequencer 44 is also provided in the system shown in FIG. 3. The matrix sequencer 44 comprises a timing and logic circuit known in the art and provides for the sequential positioning of discrete locations in the storage material 32 and for the coordination of the delivery of the reference and data pulses from the electromagnetic-radiation source 12 to various spatial storage cells of the storage material 32. Either the storage material 32 or the reference and data pulses may be aligned by the matrix sequencer 44 in order to store a data sequence in a particular storage cell. Methods and systems for changing which spatial storage cell is being addressed at a given moment in time are known in the art.

The present invention requires at least one frequency-scannable source 12 of electromagnetic radiation, such as a laser. While lasers that produce optical frequencies are preferred, other bands of electromagnetic radiation may also be utilized, depending upon the type of storage material 32 used. Examples of lasers which are suitable include, but are not limited to, frequency-scannable semiconductor lasers, and diode or otherwise pumped-tunable solid state lasers, such as titanium:sapphire lasers and dye lasers.

The frequency of the source of electromagnetic radiation is sweepable across the inhomogeneous bandwidth ($\Delta\nu_i$) of the storage material. In any event, the spectral ranges in which said radiation source is sweepable are preferably within the ultraviolet infrared, and visible spectra.

Output frequency of either Ti:sapphire or dye lasers is determined by a gross tuning element, a birefringent filter, two etalons of successively smaller free-spectral range, and the cavity mode. To perform rapid chirps on a 10-GHz scale, the cavity and thickest etalon must be tuned synchronously. The etalon is relatively easy to tune since it need only vary in optical path length by an amount comparable to the laser wavelength. An etalon made from an electro-optic material can easily be tuned as needed. The laser cavity, on the other hand, must be swept (with a 240-MHz cavity free-spectral range) over 20 wavelengths during a 10-GHz scan. This can be done either mechanically or electro-optically. In the latter case, the tuning must be done with a sawtooth voltage that performs the path change modulo one-half wavelength (i.e., cavity modes are only scanned one cavity free-spectral range and then lasing is passed over to the next cavity mode as the sawtooth voltage drops.) The laser output would then be blocked via an AOM during the voltage flyback. Mechanical scanning of the cavity pathlength will be limited to inertial effects to the longest time scales. With diode lasers the problem is, in principle, easier to solve since injection current can be used to tune the laser. With external cavity locking to narrow the diode laser's rather large linewidth, however, the tuning problem is similar to that for Ti:sapphire and dye lasers.

As discussed above, the reference pulse is frequency-offset from the data pulse by $\nu_{RD}$. The read pulse is substantially the same as the reference pulse.

If the chirp of the read pulse is a mirror image of the reference pulse, the signal pulse is a time-reverse of the data pulse. Assuming that the reference and data pulses have a frequency offset $\nu_{RD}$ comparable to the data modulation rate $\nu_m$ and that $\nu_m$ is greater than $\Delta\nu_h$, the number of spectral channels that can be accessed in a time-reversed form is reduced from the total member available by the factor $(\Delta\nu_h/\nu_m)^{\frac{1}{2}}$.

The intensities of the data, reference, and reading pulses are related to a function $\Theta_x(\nu)$ (the excitation angle) of the electromagnetic fields of each pulse. The preferred intensity of each pulse is such that the pulse causes no more than about half the absorbing atoms or molecules of the storage material at any particular absorption frequency to undergo a transition from the ground state to an excited state. In terms of $\Theta_x(\nu)$, $\Theta_x(\nu) \leq \pi/2$ for all values of $\nu$.

The power of the electromagnetic radiation source depends upon the "spot size" (related to the area dimension of a spatial storage cell) and the preferred intensity (power=intensity×spot size). The power also depends upon the absorption characteristics of the storage material and can vary greatly from material to material. For many applications, a power ranging from 0.01 to about 500 milliwatts is sufficient.

The modulators 26, 36 are devices as known in the art that amplitude-modulate, frequency-modulate, or phase-modulate a beam of electromagnetic radiation in an information-containing way. The simplest modulation scheme is simply on or off, wherein "on" represents a binary one and "off" represents a binary zero. For example, the modulators can comprise high-speed laser shutters having $10^{-0}$-second or less opening/closing time. The modulation can be acousto-optic, electro-optic, or analogous means. A acousto-optic modulator (AOM) consists of a transparent material into which very high-frequency sound waves are introduced. The density variations within the sound wave lead to a redirection of the laser beam while the sound wave is present. Such devices actually deflect the beam rather than switch it on and off. An electro-optic modulator (EOM)

relies on electrically mediated changes in the polarizing properties of certain crystals. EOMs employ, for example, an electrically "driven" crystal between two crossed linear polarizers. With no voltage on the crystal, no electromagnetic radiation is passed therethrough. Application of a voltage pulse allows the radiation to pass. Various other modulator devices are known in the art and some lasers can be modulated directly.

The modulation rate is adjusted so as to exceed $\Delta\nu_h$. In addition, the frequency sweep rate of the beam produced by the source of electromagnetic radiation should be sufficient to sweep across a frequency offset within the excitation time $(\Delta\nu_h)^{-1}$.

The detector 42 should be able to respond to the time scale of about that of a data bit; i.e., $\tau_B$, which can be whatever is convenient. Commercial semiconductor photodiodes, avalanche photodiodes, and photomultiplier tubes are available which respond on a suitable time scale and can serve as detectors. To protect the detector from extraneous radiation during data writing and at other times when the detector is not being actually employed, a shutter 46 or analogous device is employed.

The storage material 32 is selected so as to exhibit inhomogeneous absorption linewidth broadening comprising a large number of homogeneous linewidth frequencies within the inhomogeneous line bandwidth. The number of data bits in the frequency dimension is determined by $\Delta\nu_i/\Delta\nu_h$. $\Delta\nu_h$ can be as narrow as about one Kilohertz and $\Delta\nu_i$ as large as about ten Gigahertz (or larger). The ratio of these two quantities raises the possibility of storing at least $10^7$ bits of information in a single storage cell. $\Delta\nu_h$ is smaller at lower temperatures such as cryogenic temperatures (1° to about 70° K., preferably 1° to 4° K.). Thus, the data capacity of the storage material is higher at lower temperatures.

The various classes of storage materials that exhibit the requisite inhomogeneous/homogeneous absorption transition phenomenon include materials that provide a temporary memory, a permanent destructible memory, or a permanent erasable memory. The materials that exhibit a temporary memory are those in which the excited-state subpopulation of atoms or molecules relaxes to repopulate a terminal level of the ground state in such a way as to perturb the stored data in the ground-state. The perturbation occurs within about an excited-state lifetime.

Candidate materials having suitable $\Delta\nu_i$ and $\Delta\nu_h$ properties include, but are not limited to, $Eu^{3+}$-doped $Y_2O_3$, which has a $\Delta\nu_i$ value of 10 GHz and a $\Delta\nu_h$ value of 1 KHz at 4° K. Thus, this material has $10^7$; spectral channels per spatial storage cell at 4° K. Other candidate materials include $Eu^{3+}$-doped $LaF_3$, $Pr^{3+}$-doped $LaF_3$, $Pr^{3+}$-doped YAG, and $Eu^{3+}$-doped $YAlO_3$. The storage materials can be crystalline (e.g., $Y_2O_3$ is a crystal) or glassy. Examples of suitable host glasses are described in "Laser Spectroscopy of Solids," in Yen and Selzer (eds.), *Topics in Applied Physics*, vol. 49, Springer-Verlag, New York), and include, but are not necessarily limited to, $SiO_2$, $GeO_2$, $B_2O_3$, and $P_2O_5$. Examples of suitable rare earth-doped glasses include Eu-doped silicate glasses, phosphate glasses, borate glasses, fluoroberyllate glasses, and fluorophosphate glasses; as well as $Pr^{3+}$-doped fluoroberyllate glasses. Organic glasses are also known in the art.

Typical input-pulse durations, chirp rates, and other data for two different classes (crystalline and glassy) of storage materials are given in Table 1.

TABLE 1

| Host | $\Delta\nu_h$ (MHz) | $\Delta\nu_i$ (GHz) | Spectral Channels | Spectral Offset | Min. Chirp Rate (GHz/Sec)* | Max Data Pulse Duration (Sec) | Max Time-Reversible Modul Rate** (MHz) | Max No. Time-Reversible Bits |
|---|---|---|---|---|---|---|---|---|
| Crystal | $10^{-3}$ | 10 | $10^7$ | 100 | 100 | 0.1 | 0.3 | $3 \times 10^4$ |
| Glassy | $10^2$ | $10^3$ | $10^4$ | 300 | $3 \times 10^7$ | $3 \times 10^{-5}$ | 200 | $6 \times 10^3$ |

*Assuming a data in/out rate equal to $\nu_{RD}$
**with the specified chirp rate

General Considerations for Swept-Carrier Memory Systems

A swept-carrier memory system requires a storage material having desired properties of $\Delta\nu_h$ and $\Delta\nu_i$. The material should also have a suitable absorption coefficient and transition wavelength.

The spatial storage cells should satisfy the following conditions: (a) They should be about one absorption length thick. (b) They should have a volume sufficient to ensure that the cells have about $10^4$ "absorber" atoms or molecules per cell. More absorber atoms or molecules can be present in each cell, which can result in more intense signal pulses, but the excess atoms or molecules will result in lower data storage densities in the storage material and higher than minimal excitation pulse intensities.

A wide range of data modulation rates are possible and consistent with full utilization of all available channels in the storage cells of the material. The allowable range is $0 < \nu_m \leq \Delta\nu_i$. Of course, $\Delta_m = 0$ would provide no data storage and would be of no practical utility. $\Delta_m$ is also chosen to be compatible with achievable source and detector capabilities.

Once $\nu_m$ is chosen, $\nu_{RD}$ is set so that $\nu_{RD} > \nu_m$. The most useful implementation (and the implementation that is consistent with maximal storage density) has $\nu_{RD} \approx \nu_m$. If $\nu_{RD}$ turns out to be substantially less than $\Delta\nu_h$, then $\nu_{RD}$ can be substantially equal to zero.

Once $\nu_{RD}$ is selected, the chirp rate is set so as to satisfy the relation $r_{CH}\tau_h \geq \text{Max}(\nu_{RD}, \nu_m)$. This inequality will maximize storage intensity.

Reference and read pulse intensities are set so that each pulse acting alone promotes about half of the active atoms or molecules within each spectral channel to their excited state. Data pulse intensity should be chosen as large as possible but should not (acting alone) lead to promotion of more than half of the active atoms or molecules within any storage cell to their excited state. If these conditions are satisfied, the signal field (before accounting for the effect of relaxation of the storage material) will be about one percent as intense (and contain one percent as much power) as the data pulse used to store the data. Also, each output bit will contain a number of photons equal to one percent of the number of absorber atoms or molecules per spectral channel.

The total frequency sweep range $\nu_{CH}$ is set so as to satisfy the relation $\nu_{CH} \leq \Delta\nu_i$. The equality maximizes the data storage density in the material. If $r_{CH}$ is chosen so as to satisfy the relation $r_{CH} > \nu_m^2$, then the normal requirement that the reference and read pulses be identical is relaxed. In this latter case, the read pulse may have a separate chirp rate widely different from the chirp rate of the reference pulse ($r_{CH}$). If $r_{CH}^{read} = -r_{CH}$ (where $-r_{CH}$ indicates a chirp proceeding across the storage bandwidth in a sense opposite to that of the reference pulse, the data will emerge from the cell in reverse order. Different magnitudes and signs of $r_{CH}^{read}$ lead to time-forward and time-reversed signal pulses whose bit rates $\nu_m^{signal}$ are less than or greater than $\nu_m$.

Storage and Processing of Temporally Evolving Images

If a multitude of spatial storage cells are used simultaneously to store data, then the storage material can be used to record time-dependent images. Design constraints with such a system are the same as in normal data memory applications, except that the same conditions are satisfied simultaneously at each storage cell employed to store the image.

Figure 4:
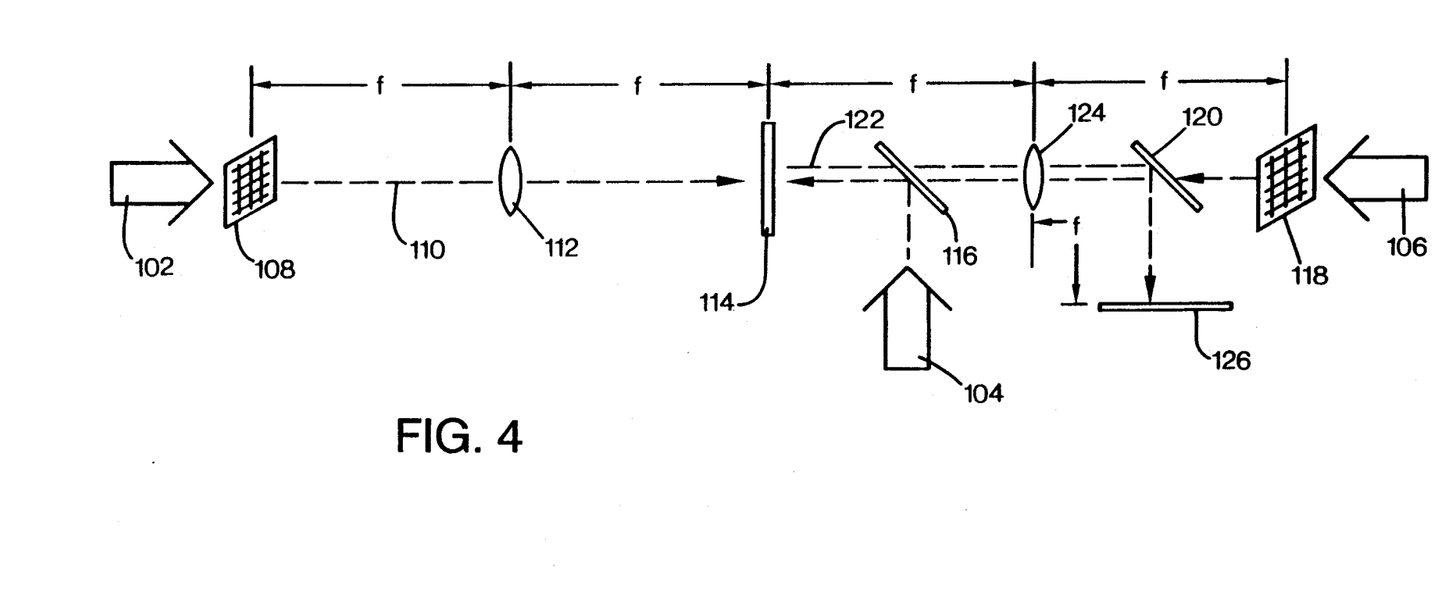
FIG. 4 is a schematic diagram of an alternative embodiment of an optical memory according to the present invention usable for recording images and sequences of images.

An embodiment of a time-dependent image storage and processing device according to the present invention is shown schematically in FIG. 4. In the FIG. 4 embodiment, a data pulse 102, a reference pulse 104, and a read pulse 106 are each produced by a separate collimated source of electromagnetic radiation (not shown). These pulses have the same character as described above for use in normal data memory applications, except that in the FIG. 4 embodiment, said pulses are used for spatial-image processing. A first time-dependent image 108 (mask) is positioned in front of the data pulse 102. The dashed line 110 indicates the propagation vector of the data pulse 102 after passing through the first image 108, which passes through a first lens 112 separated from the first image 108 by a distance f. The storage material 114 is positioned a distance f from the first lens 112 (and a distance 2f from the image 108). The reference pulse 104 having a planar wavefront reflects from a first beam splitter 116 so as to impinge on the storage material 114. The first beam splitter 116 also allows passage therethrough of the read pulse 106 after passage (in image-processing applications) through a second time-dependent image (mask) 118 and a second beam splitter 120. (In image-storage applications, mask 118 is absent.) A signal pulse 122 generated by the storage material 114 upon being exposed to the read pulse 106 passes through the first beam splitter 116 and a second lens 124, and is reflected by the second beam splitter 120 onto a screen 126 on which a reproduction of time-dependent image 108 is produced in image-storage applications and a time-dependent image constituting the convolution of images 108 and 118 presenting at corresponding times in the data and read pulses is produced in the image-processing applications.

Temporal Waveform Processing

The temporal waveform convolver application described above and shown in FIG. 4 is based on the following definitions: Let g(t) and h(t) be functions of time. The cross-correlation f(t) of (g)t and h(t) is:

$$f(t) = g(t) \quad h(t) = \int_{-\infty}^{\infty} g(u - t)h(u)du \quad [6]$$

If g(t) and h(t) are the same function, then f(t) is very large at t=0, resulting in temporal pattern recognition. Convolution is defined as:

$$f(t) = g(t) * h(t) = \int_{-\infty}^{\infty} g(u)h(t - u)du \quad [7]$$

In a swept-carrier method according to the present invention implemented at a single spatial storage cell having a relatively large volume (relative to storage-cell volumes normally used to store data), one can impose data modulation on the data pulse and both the reference and read pulses or on the data pulse and either the read or reference pulses. Thus, $$E_{signal}(t) = E_{data}(t) * [E_{ref}(t) \quad E_{read}(t)] \quad [8]$$

where $E_{signal}(t)$ is the convolution of $E_{data}(t)$ with the cross-correlation of $E_{ref}(t)$ with $E_{read}(t)$

Separate Read and Write Laser Embodiment

Figure 5:
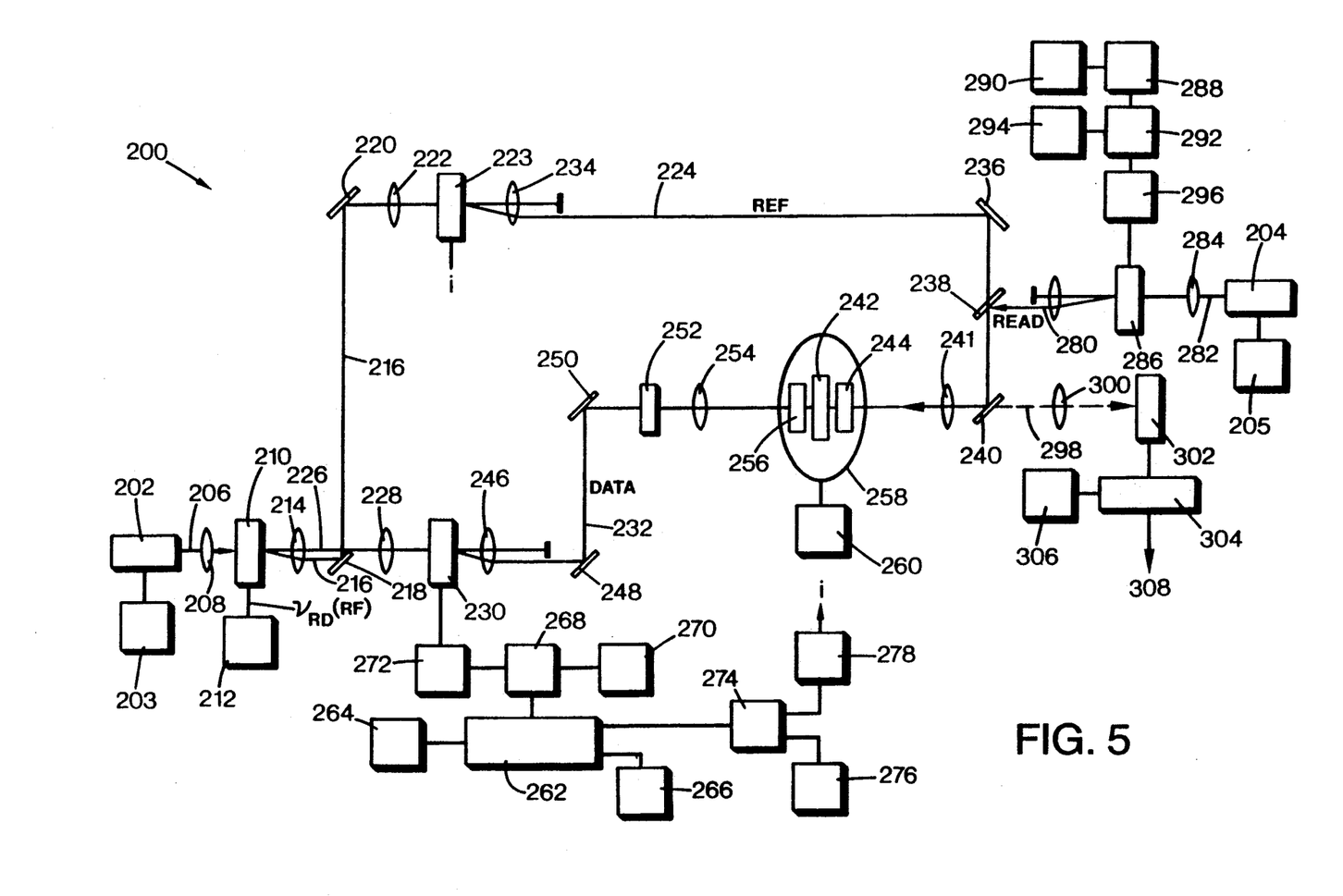
FIG. 5 is a schematic diagram of yet another alternative embodiment of an optical memory according to the present invention that utilizes separate lasers for data writing and data reading.

An embodiment of an apparatus 200 according to the present invention for data writing and reading utilizing separate lasers for writing and reading is shown schematically in FIG. 5 and described briefly as follows:

The data writing source (reference and data pulses) is a first chirpable laser 202; the data reading source is a second chirpable laser 204. Each laser is controlled by master control logic 203 and 205, respectively. The first laser 202 produces a beam that passes through a first lens 208, then into a first modulator 210. The first modulator 210 is controlled by an RF oscillator 212 or analogous device. The modulator 212 splits the beam, and passes them through a second lens 214. A first split beam 216 is reflected by mirrors 218 and 220, refracted by a lens 222, and enters a second modulator 223 that produces from the first split beam a reference beam 224. A second split beam 226 produced by the first modulator 210 passes through a lens 228 to a third modulator 230 that produces from the second split beam a data beam 232. From the second modulator 223, the reference beam 224 passes through a lens 234, is reflected from a mirror 236, passes through a first beam splitter 238, a second beam splitter 240, a lens 241, and is directed onto the storage material 242 (after passing through a first beam displacer 244. The data beam 232 passes through a lens 246, is reflected from mirrors 248, 250, through a shutter 252, another lens 254, and a second beam displacer 256 onto the storage material 242. (The storage material 242 is maintained at a cryogenic temperature via a cryostat 258 or analogous means supplied by coolant from a source 260 thereof.)

The third modulator 230 is controlled so as to produce the data pulse 232 by a data segmentor and reference-pulse controller 262, which is supplied with data from an external source 264. The segmentor 262 is controlled by master timer and control logic 266. Data from the segmentor 262 are passed through a first RF mixer 268 (which receives signals from an RF oscillator 270) and a first RF power amplifier 272. Likewise, the segmenter 262 sends data through a second RF mixer 274

(which receives signals from an RF oscillator 276) and a second RF power amplifier 278, which, in turn, controls the second modulator 223.

A read pulse 280 is generated by the second laser 204. The laser beam 282 passes through a lens 284 and a fourth modulator 286. The fourth modulator 286 is controlled by a read-pulse controller 288 (which, in turn, is controlled by master timer and control logic 290. Output from the read-pulse controller 288 is conducted through an RF switch 292 (controlled by an RF oscillator 294) and an RF power amplifier 296.

Signal pulses 298 emanating from the storage material 242 pass through the beam splitter 240 and a lens 300 to a detector 302. Output from the detector 302 is conducted to a decoder 304 which is also controlled by master timer and control logic 306. The resulting processed data is routed to external applications 308.

Notable features of the present invention include the following:

(a) The reference and data pulses occur substantially cotemporally.

(b) It is possible to extend the duration during which data is written into a storage cell to a length much longer than $\Delta\nu_h$. For example, if each cell contains $10^7$ spectral channels, then the writing time $\tau_{WR}$ can be as long as $(10^7)(\Delta\nu_h)^{-1}$. This eliminates the time constraint characteristic of conventional time-domain FSDS methods.

(c) The correlation in conventional time-domain FSDS between modulation rate $\nu_m$ and $\Delta\nu_i$ is eliminated. The entire inhomogeneous bandwidth $\Delta\nu_i$ of the storage material can now be used, even at relatively slow modulation rates (such as achievable by modern technology).

(d) Signal-pulse intensity is constant throughout a sweep across the entire inhomogeneous bandwidth. I.e., any coherence loss of the signal pulse is constant, yielding a fixed intensity of zeros and ones across the entire frequency sweep.

Other features of the present invention include the following:

(1) A wide range of data modulation rates are possible, up to $\Delta\nu_i$, which are compatible with full spectral utilization. Thus, the present invention can be used with a much broader range of storage materials than previous optical data storage methods. Also, higher storage-material temperatures can be used.

(2) Data signal pulses have essentially constant amplitude.

(3) Data pulse durations can be long, rendering the present invention compatible with long data segments.

(4) Because the present invention is compatible with long data pulses, much lower pulse intensities are required than with previous methods.

(5) The present invention allows an extended interval of excitation, which minimizes deleterious effects and excitation-induced frequency shifts in storage materials.

(6) The severity of quantum interference effects resulting from energy level multiplicities is reduced over previous methods.

(7) The present invention permits image processing of long trains of images at high speed.

(8) The present invention allows partial retrieval of stored pulse trains by a sweep of the read pulse frequency over a portion of the spectral bandwidth.

(9) The present invention allows time-reversal of recalled pulse trains.

(10) The present invention allows variable data output rates relative to input rates at low $\nu_m$.

While the present invention has been described in connection with preferred embodiments, it will be understood that it is not limited to those embodiments. On the contrary, it is intended to cover all alternatives, modifications, and equivalents as may be included within the spirit and scope of the invention as defined in the appended claims.

I claim:

1. A method of storing data, comprising:
   (a) providing a material having a storage cell capable of absorbing electromagnetic radiation within an inhomogeneously broadened bandwidth $\Delta\nu_i$ and having $\Delta\nu_i/\Delta\nu_h$ spectral channels each having a homogeneous linewidth $\Delta\nu_h$ within the inhomogeneously broadened bandwidth;
   (b) providing a reference pulse of the electromagnetic radiation that is frequency-chirped across $\Delta\nu_i$;
   (c) providing a data pulse of the electromagnetic radiation, the data pulse being frequency-chirped across $\Delta\nu_i$ at a frequency offset of $\nu_{RD}$ relative to the reference pulse and having an envelope onto which data has been encoded; and
   (d) optically exposing the storage cell to the data and reference pulses such that the data pulse is cotemporal with the reference pulse so as to cause the data to become stored in the storage cell.

2. A method of storing data as recited in claim 1 wherein steps (b) and (c) comprise generating the reference and data pulses using a frequency-swept laser.

3. A method of storing data as recited in claim 1 wherein, in step (c), the data is encoded onto the envelope of the data pulse by modulating the data pulse.

4. A method of storing data as recited in claim 3 wherein the data is encoded onto the envelope of the data pulse by amplitude-modulating the data pulse.

5. A method of storing data as recited in claim 3 wherein the data is encoded onto the envelope of the data pulse by frequency-modulating the data pulse.

6. A method of storing data as recited in claim 3 wherein the data is encoded onto the envelope of the data pulse by phase-modulating the data pulse.

7. A method of storing data as recited in claim 3 wherein the data pulse is modulated at a rate $\nu_m < < \Delta\nu_i$ so as to encode the data.

8. A method of storing data as recited in claim 7 wherein $\nu_m > \Delta\nu_h$.

9. A method of storing data as recited in claim 8 wherein $\nu_m < \nu_{RD}$.

10. A method of storing data as recited in claim 8 wherein:
   (a) each spectral channel of the storage cell has a homogeneous dephasing time $\tau_h = (\Delta\nu_h)^{-1}$;
   (b) the reference and data pulses comprise a writing sequence having a duration $\tau_{WR}$;
   (c) the reference and data pulses are frequency-chirped over a frequency interval $\nu_{CH}$; and
   (d) $(\nu_{CH}/\tau_{WR})\tau_h > \nu_m$.

11. A method of storing data as recited in claim 10 wherein the writing sequence has a duration $$\tau_{WR}{}^{max} \approx \Delta\nu_i \tau_h / \nu_m.$$

12. A method of storing data as recited in claim 8 wherein $\nu_{CH} \leq \Delta\nu_i$.

13. A method of storing data, comprising:

(a) providing a material having a storage cell capable of absorbing electromagnetic radiation within an inhomogeneously broadened bandwidth $\Delta v_i$ and having $\Delta v_i/\Delta v_h$ spectral channels each having a homogeneous linewidth $\Delta v_h$ within the inhomogeneously broadened bandwidth;

(b) providing a reference pulse of the electromagnetic radiation that is frequency-chirped across $\Delta v_i$;

(c) providing a data pulse of the electromagnetic radiation, the data pulse being frequency-chirped across $\Delta v_i$ at a frequency offset of $v_{RD}$ relative to the reference pulse and over a frequency range of $v_{CH}$, the data pulse having a modulated waveform encoding data on the data pulse; and (d) optically exposing the storage cell to the data and reference pulses such that the data pulse is cotemporal with the reference pulse so as to cause the data to become stored in the storage cell.

14. A method of storing data, comprising:

(a) providing a material having a storage cell capable of absorbing electromagnetic radiation within an inhomogeneously broadened bandwidth $\Delta v_i$ and having $\Delta v_i/\Delta v_h$ spectral channels each having a homogeneous linewidth $\Delta v_h$ within the inhomogeneously broadened bandwidth;

(b) providing a writing sequence comprising a reference pulse of the electromagnetic radiation that is frequency-chirped across $\Delta v_i$ and a data pulse of the electromagnetic radiation that is cotemporal with the reference pulse and frequency-chirped across $\Delta v_i$ at a frequency offset of $v_{RD}$ relative to the reference pulse, the data pulse having an envelope onto which data has been encoded; and (c) optically exposing the storage cell to the writing sequence so as to cause the data to become stored in the storage cell.

15. A method of storing and retrieving data, comprising:

(a) providing a material having a storage cell capable of absorbing electromagnetic radiation within an inhomogeneously broadened bandwidth $\Delta v_i$ and having $\Delta v_i/\Delta v_h$ spectral channels each having a homogeneous linewidth $\Delta v_h$ within the inhomogeneously broadened bandwidth;

(b) providing a reference pulse of the electromagnetic radiation that is frequency-chirped across $\Delta v_i$;

(c) providing a data pulse of the electromagnetic radiation, the data pulse being frequency-chirped across $\Delta v_i$ at a frequency offset of $v_{RD}$ relative to the reference pulse and having an envelope onto which data has been encoded;

(d) optically exposing the storage cell to the data and reference pulses such that the data pulse is cotemporal with the reference pulse so as to cause the data to become stored in the storage cell;

(e) providing a read pulse substantially identical to the reference pulse; and (f) optically exposing the storage cell to the read pulse after the reference and data pulses so as to cause the storage cell to generate a signal pulse comprising the encoded data.

16. A data storage system, comprising:

(a) a storage material having a storage cell, the storage cell capable of absorbing electromagnetic radiation within an inhomogeneously broadened bandwidth $\Delta v_i$ and having $\Delta v_i/\Delta v_h$ spectral channels each having a homogeneous linewidth $\Delta v_h$ within $\Delta v_i$;

(b) means for generating a first pulse of electromagnetic radiation absorbable by the storage cell, the first pulse including information encoded therein and having an instantaneous frequency $v_D(t)$ within $\Delta v_i$;

(c) means for ramping $\Delta v_D(t)$ over a frequency interval $\Delta_{CH} \leq \Delta v_i$ so to impose a frequency chirp on the first pulse;

(d) means for generating a second pulse of electromagnetic radiation absorbable by the storage cell, the second pulse having an instantaneous frequency of $v_R(t)$ within $\Delta v_i$;

(e) means for ramping $v_R(t)$ over the frequency interval $v_{CH} \leq \Delta v_i$ so as to impose a frequency chirp on the second pulse, the frequency chirp on the second pulse having a frequency offset relative to $v_D(t)$ of $v_{RD} = v_R(t) - v_D(t)$; and (f) means for illuminating the storage cell cotemporally with the frequency-chirped first and second pulses so as to cause the information in the first pulse to be stored in the storage cell.

17. A data storage system as recited in claim 16 wherein said means for ramping $v_D(t)$ comprises means for ramping $v_D(t)$ substantially linearly over $v_{CH}$.

18. A data storage system as recited in claim 16 wherein said means for generating the first pulse and said means for generating the second pulse comprise a frequency-scannable laser adapted to generate a laser beam.

19. A data storage system as recited in claim 16 further comprising means for splitting the laser beam so as to form the first pulse and the second pulse.

20. A data storage system as recited in claim 19 wherein said means for splitting the laser beam comprises a frequency shifter.

21. A data storage system as recited in claim 16 wherein said means for generating the first pulse comprises a first frequency-scannable laser and said means for generating the second pulse comprises a second frequency-scannable laser.

22. A data storage system as recited in claim 16 wherein the storage material comprises multiple storage cells.

23. A data storage system as recited in claim 22 further comprising means for selectively positioning the storage material such that each storage cell in which information is to be stored is exposed to a first pulse and a cotemporal second pulse.

24. A data storage system as recited in claim 23 wherein said means for selectively positioning the storage material comprises a matrix sequencer operably coupled to the storage material.

25. A data storage system as recited in claim 16 further comprising means for encoding information into the first pulse.

26. A data storage system as recited in claim 25 wherein said means for encoding information into the first pulse comprises a data source and a modulator coupling the data source to said means for generating the first pulse.

27. A data storage system, comprising:

(a) a storage material having plural storage cells each adapted to absorb electromagnetic radiation within an inhomogeneously broadened bandwidth $\Delta v_i$, and each having $n_c = \Delta v_i/\Delta v_h$ spectral channels each having a homogeneous linewidth $\Delta v_h$ within $\Delta v_i$;

(b) means for generating discrete data pulses encoded with information, each data pulse being comprised of electromagnetic radiation absorbable by the storage cells and having an instantaneous frequency $\nu_D(t)$ within $\Delta\nu_i$;

(c) means for ramping $\nu_D(t)$ over a frequency interval $\nu_{CH} \leq \Delta\nu_i$ so as to impose a frequency-chirp on each data pulse;

(d) means for generating discrete reference pulses of electromagnetic radiation absorbable by the storage cells, each reference pulse having an instantaneous frequency of $\nu_R(t)$ within $\Delta\nu_i$;

(e) means for ramping $\nu_R(t)$ over the frequency interval $\nu_{CH} \leq \Delta\nu_i$ so as to impose a frequency-chirp on each reference pulse, the frequency chirp on each reference pulse having a frequency offset relative to $\nu_D(t)$ of $\nu_{RD} = \nu_R(t) - \nu_D(t)$; and (f) means for illuminating individual storage cells of the storage material cotemporally with a frequency-chirped data pulse and a corresponding frequency-chirped reference pulse so as to cause the information in the data pulse to be stored in the corresponding storage cell.

28. A data storage and retrieval system, comprising:

(a) a storage material having a storage cell, the storage cell capable of absorbing electromagnetic radiation within an inhomogeneously broadened bandwidth $\Delta\nu_i$ and having $\Delta\nu_i/\Delta\nu_h$ spectral channels each having a homogeneous linewidth $\Delta\nu_h$ within $\Delta\nu_i$;

(b) means for generating a first pulse of electromagnetic radiation absorbable by the storage cell, the first pulse including information encoded therein and having an instantaneous frequency $\nu_D(t)$ within $\Delta\nu_i$;

(c) means for ramping $\nu_D(t)$ over a frequency interval $\nu_{CH} \leq \Delta\nu_i$ so as to impose a frequency chirp on the first pulse;

(d) means for generating a second pulse of electromagnetic radiation absorbable by the storage cell, the second pulse having an instantaneous frequency of $\nu_R(t)$ within $\Delta\nu_i$;

(e) means for ramping $\nu_R(t)$ over the frequency interval $\nu_{CH} \leq \Delta\nu_i$ so as to impose a frequency chirp on the second pulse, the frequency chirp on the second pulse having a frequency offset relative to $\nu_D(t)$ of $\nu_{RD} = \nu_R(t) - \nu_D(t)$;

(f) means for illuminating the storage cell cotemporally with the frequency-chirped first and second pulses so as to cause the information in the first pulse to be stored in the storage cell;

(g) means for generating a ramped third pulse of electromagnetic radiation absorbable by the storage cell; and (h) means for illuminating the storage cell, containing information previously stored in the cell by the first and second pulses, with the third pulse so as to cause the cell to produce a signal pulse encoding the information.

29. A system as recited in claim 28 wherein said means for generating a ramped third pulse comprises means for generating a pulse having a ramped profile substantially the same as the second pulse.

30. A system as recited in claim 28 wherein said means for generating a ramped third pulse comprises means for generating a pulse that is substantially a mirror image of the second pulse.

31. A data storage and retrieval system comprising:

(a) a storage material having plural storage cells each adapted to absorb electromagnetic radiation within an inhomogeneously broadened bandwidth $\Delta\nu_i$, and each having $n_c = \Delta\nu_i/\Delta\nu_h$ spectral channels each having a homogeneous linewidth $\Delta\nu_h$ within $\Delta\nu_i$ and each having a homogeneous dephasing time of $\tau_h = \Delta\nu_h^{-1}$;

(b) means for generating discrete data pulses of electromagnetic radiation absorbable by the storage cells, each data pulse including information encoded therein and having an instantaneous frequency $\nu_D(t)$ within $\Delta\nu_i$;

(c) means for ramping $\nu_D(t)$ over a frequency interval $\nu_{CH} \leq \Delta\nu_i$ so as to impose a frequency chirp on each data pulse at a rate $r_{CH}$;

(d) means for generating discrete reference pulses of electromagnetic radiation absorbable by the storage cells, each reference pulse having an instantaneous frequency of $\nu_R(t)$ within $\Delta\nu_i$;

(e) means for ramping $\nu_R(t)$ over the frequency interval $\nu_{CH} \leq \Delta\nu_i$ so as to impose a frequency-chirp on each reference pulse, the frequency chirp on each reference pulse having a rate substantially equal to $r_{CH}$ but having a frequency offset relative to $\nu_D(t)$ of $\nu_{RD} = \nu_R(t) - \nu_D(t)$;

(f) means for illuminating a storage cell of the storage material cotemporally with a frequency-chirped data pulse and a corresponding frequency-chirped reference pulse so as to cause the information in the data pulse to be stored in the storage cell;

(g) means for generating discrete read pulses of electromagnetic radiation absorbable by the storage cells, each read pulse being frequency-ramped over the interval $\nu_{CH}$ at the rate $r_{CH}$;

(h) means for illuminating a selected storage cell, containing information stored from a preceding data pulse, with a read pulse within a time $\leq \tau_h$ after illuminating said cell with said preceding data pulse so as to cause the cell to produce a signal pulse encoding the information; and (i) means for detecting the signal pulse.

32. A data storage system, comprising:

(a) a storage material having plural storage cells each adapted to absorb electromagnetic radiation within an inhomogeneously broadened bandwidth $\Delta\nu_i$, and each having $n_c = \Delta\nu_i/\Delta\nu_h$ spectral channels each having a homogeneous linewidth $\Delta\nu_h$ within $\Delta\nu_i$;

(b) a frequency-chirpable source of data pulses and reference pulses of monochromatic electromagnetic radiation absorbable by the storage material, the data pulses each having an instantaneous frequency $\nu_D(t)$ within $\Delta\nu_i$ wherein $\nu_D(t)$ is ramped over a frequency interval $\nu_{CH} \leq \Delta\nu_i$ so as to impose a frequency chirp on each data pulse, and the reference pulses each being cotemporal with a corresponding data pulse and having an instantaneous frequency $\nu_R(t)$ within $\Delta\nu_i$ wherein $\nu_R(t)$ is ramped over the frequency interval $\nu_{CH}$ at a frequency offset relative to $\nu_D(t)$ of $\nu_{RD} = \nu_R(t) - \nu_D(t)$;

(c) a modulator, operably coupled to the source of data pulses, adapted for encoding information in the data pulses; and d) a matrix sequencer adapted for displacing the storage material and the source of data and reference pulses relative to each other so as to permit individual illumination of the storage cells by a reference pulse and a corresponding cotemporal data pulse so as to store the information encoded in the corresponding data pulse in the storage cell.

33. A data storage system as recited in claim 32 wherein the source of data and reference pulses comprises a laser which produces a monochromatic light beam.

34. A data storage system as recited in claim 33 further comprising a frequency shifter adapted for splitting the light beam produced by the laser into data pulses and corresponding reference pulses.

35. A data storage system as recited in claim 32 wherein the source of data pulses comprises a first laser and the source of reference pulses comprises a second laser.

36. A data storage and retrieval system, comprising:
(a) a storage material having plural storage cells each adapted to absorb electromagnetic radiation within an inhomogeneously broadened bandwidth $\Delta\nu_i$, and each having $n_c = \Delta\nu_i/\Delta\nu_h$ spectral channels each having a homogeneous linewidth $\Delta\nu_h$ within $\Delta\nu_i$;
(b) a frequency-chirpable source of data pulses, reference pulses, and read pulses of monochromatic electromagnetic radiation absorbable by the storage material, the data pulses each having an instantaneous frequency $\nu_D(t)$ within $\Delta\nu_i$ wherein $\nu_D(t)$ is ramped over a frequency interval $\nu_{CH} \leq \Delta\nu_i$ so as to impose a frequency chirp on each data pulse, the reference pulses each being cotemporal with a corresponding data pulse and having an instantaneous frequency $\nu_R(t)$ within $\Delta\nu_i$ wherein $\nu_R(t)$ is ramped over the frequency interval $\nu_{CH}$ at a frequency offset relative to $\nu_D(t)$ of $\nu_{RD} = \nu_R(t) - \nu_D(t)$, and the read pulses each being distinct from the data and reference pulses and having a ramped frequency profile either substantially the same as or a mirror image of a reference pulse;
(c) a modulator, operably coupled to the source of data pulses, adapted for encoding information in the data pulses;
(d) a matrix sequencer adapted for displacing the storage material and the source of data, reference, and read pulses relative to each other so as to permit selective illumination of each storage cell of a population of storage cells on the storage material:
(i) by a reference pulse and a corresponding cotemporal data pulse so as to cause the information encoded in the corresponding data pulse to be stored in the storage cell, and (ii) within a time $\leq \tau_h$ after illumination of the storage cell by the data and reference pulses, by a subsequent read pulse so as to cause the cell to produce a signal pulse encoding the stored information; and
(e) a detector for receiving the signal pulse.

37. A system as recited in claim 36, wherein the source of data, reference, and read pulses comprises a separate laser adapted to produce the data, reference, and read pulses, respectively.

* * * * *

UNITED STATES PATENT AND TRADEMARK OFFICE
CERTIFICATE OF CORRECTION

PATENT NO.   : 5,276,637
DATED        : January 4, 1994
INVENTOR(S)  : THOMAS W. MOSSBERG It is certified that error appears in the above-identified patent and that said Letters Patent is hereby corrected as shown below:

On the Cover Page:

On the cover page under the heading "[73] Assignee:", "Ohio" should be --Oregon--.

In the Abstract: (Item [57])

On line 4 of the abstract, "special" should be --spacial--.

Column 3, line 56, "$\Delta v_h$" should be --$\Delta t_h$--.

Column 8, line 42, after the word "duration" should be --of the writing sequence must be no greater than $\tau_h$. Also,--.

Column 12, line 60, "$10^{-0}$-second" should be --$10^{-9}$-second--.

Column 14, line 35, after the word "per" should be --spectral channel within the--.

Column 14, line 44, "$\Delta_m=0$" should be --$v_m=0$--.

Column 14, line 45, "$\Delta_m$" should be --$v_m$--.

Column 15, line 11, a space should exist between "-$r_{CH}$" and "(where", and between "-$r_{CH}$" and "indicates".

Column 15, line 13, "pulse," should be --pulse),--.

UNITED STATES PATENT AND TRADEMARK OFFICE
CERTIFICATE OF CORRECTION

PATENT NO. : 5,276,637
DATED : January 4, 1994
INVENTOR(S) : THOMAS W. MOSSBERG

It is certified that error appears in the above-identified patent and that said Letters Patent is hereby corrected as shown below:

Column 18, line 66, "claim 8" should be --claim 10--.

Column 20, line 6, "$\Delta_D(t)$" should be --$v_D(t)$--.

Column 20, line 7, "$\Delta_{CH} \leq \Delta v_i$" should be --$v_{CH} \leq \Delta v_i$--.

Signed and Sealed this

Eleventh Day of October, 1994

Attest:

BRUCE LEHMAN

Attesting Officer     Commissioner of Patents and Trademarks